United States Patent
Oki

(10) Patent No.: US 6,211,689 B1
(45) Date of Patent: Apr. 3, 2001

(54) METHOD FOR TESTING SEMICONDUCTOR DEVICE AND SEMICONDUCTOR DEVICE WITH TRANSISTOR CIRCUIT FOR MARKING

(75) Inventor: Yasumitsu Oki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/229,749

(22) Filed: Jan. 14, 1999

(30) Foreign Application Priority Data

Jan. 14, 1998 (JP) .................................................. 10-006110

(51) Int. Cl.[7] .................................................. G01R 31/02
(52) U.S. Cl. ............................ 324/759; 324/769; 327/537
(58) Field of Search .................................... 324/760, 754, 324/759, 765, 158.1; 327/534, 535, 536, 537, 371; 361/56, 111; 257/369, 370, 372

(56) References Cited

U.S. PATENT DOCUMENTS

| | | | |
|---|---|---|---|
| 5,473,500 | * | 12/1995 | Payne et al. .......................... 361/111 |
| 5,721,445 | * | 2/1998 | Singh et al. .......................... 257/369 |
| 5,917,689 | * | 6/1999 | English et al. ........................ 361/56 |
| 6,023,186 | * | 2/2000 | Kuroda .................................. 327/534 |

FOREIGN PATENT DOCUMENTS

| | | |
|---|---|---|
| 61-64137 | 4/1986 | (JP) . |
| 63-102332 | 5/1988 | (JP) . |
| 2-90549 | 3/1990 | (JP) . |
| 3-196539 | 8/1991 | (JP) . |
| 5-198630 | 8/1993 | (JP) . |
| 6-53292 | 2/1994 | (JP) . |
| 9-199672 | 7/1997 | (JP) . |

* cited by examiner

Primary Examiner—Safet Metjahic
Assistant Examiner—Minh Tang
(74) Attorney, Agent, or Firm—Foley & Lardner

(57) ABSTRACT

A transistor circuit for marking is provided at a semiconductor chip. This circuit includes a P-type MOS transistor and an N-type MOS transistor connected in series between a power supply pad and a ground pad, the first inverter connected to a test signal terminal and having an output terminal connected to a drain of the N-type MOS transistor and the second inverter into which an output signal of the first inverter is inputted and an output terminal of which is connected to a drain of the P-type MOS transistor. If a chip functional test is performed and the chip is determined as a defective, then a signal inputted to the terminal is turned into a high level to cause latch-up to occur to the marking transistor circuit and the transistor is damaged, whereby the marking transistor circuit can be visually identified. As a result, it is possible to ensure identify a defective chip and to prevent adversely affecting adjacent chips.

2 Claims, 6 Drawing Sheets

METHOD FOR TESTING SEMICONDUCTOR DEVICE AND SEMICONDUCTOR DEVICE WITH TRANSISTOR CIRCUIT FOR MARKING

BACKGROUND OF THE INVENTION

1. Field of the Invention

The present invention relates to a method for testing a semiconductor device provided with a transistor circuit marking capable of causing damage which can be visually identified by latch-up to identify a chip on a wafer which has been determined as defective by a functional test, and a semiconductor device with a transistor circuit for marking.

2. Description of the Related Art

When a functional test on a wafer is conducted, it is necessary that chip determined as a defective is marked. Normally, marking of the defective chip is effected by using mechanical means such as an inker provided at a probing unit. There is the fear that a chip next to a defective chip may be erroneously marked when a marking position is shifted in a case of employing such mechanical means. There has been, thus, proposed a marking method by providing a special circuit in an LSI without using mechanical means.

FIG. 1 is a typical plan view of a semiconductor chip to describe a method for marking a semiconductor device as described in Japanese Patent Application Laid-Open No. 61-64137. This semiconductor chip 34 is provided with a marking dedicated pad 31, a GND pad 32 and a circuit for marking 33. The circuit for marking 33 consists of a material which can be easily fused such as aluminum. One end of the circuit 33 is connected to the marking dedicated pad 31 and the other end thereof is connected to the GND pad 32.

In the conventional semiconductor device, when the chip is determined as a defective by the wafer functional test, the circuit for marking 33 is fused by applying a high voltage or high current to the marking dedicated pad 31. Thereafter, the fused portion is visually identified and the defective chip is thereby screened.

Meanwhile, Japanese Patent Application Laid-Open No. 63-102332 discloses a method for identifying a defective chip wherein a thermal coloring matter or resin containing the thermal coloring matter is applied on the surfaces of chips of a semiconductor device in advance and a defective chip, if any, is colored by applying a current to the coloring matter and identified as such.

In addition, Japanese Patent Application Laid-Open No. 2-90549 discloses a semiconductor device having a memory cell for inputting and storing a case of a non-defective chip or defective.

Moreover, Japanese Patent Application Laid-Open No. 6-53292 discloses a method for inspecting a semiconductor device capable of detecting, for example, visually that a semiconductor integrated circuit part is abnormal by applying an excessive voltage to a power supply terminal of an operational check circuit part to thereby break the operational check circuit part.

Furthermore, Japanese Patent Application Laid-Open No. 9-199672 discloses a method for inspecting a semiconductor integrated circuit device having a structure in which a fuse is provided in the middle of each of the wirings connected to the first and second electrodes and to an internal circuit, a voltage exceeding input allowable level is supplied to both the first and second electrodes to disconnect the fuse, thereby stopping supplying power to the internal circuit of a defective chip.

The conventional technique described in Japanese Patent Application Laid-open No. 61-64137 has the following problems. First, if insufficient voltage or current is applied, the marking circuit 33 may not be fused. If so, a defective chip is determined as a non-defective. Second, contrary to the first, if an excessive current or voltage is applied, there is a fear of breaking not only a defective but also a chip next to the defective chip.

As for the other references stated above, the methods described therein have similar problems; i.e., if an excessive current or voltage is applied or a voltage applied is lower than an operating voltage, a defective chip may not be possibly identified. Besides, the technique of Japanese Patent Application Laid-Open No. 2-90549 has a disadvantage in that a dedicated memory cell is necessary.

SUMMARY OF THE INVENTION

It is an object of the present invention to provide a method for testing a semiconductor device which can ensure identifying a defective chip and which does not adversely affect chips adjacent to the defective chip, and to provide a semiconductor device with a transistor circuit for marking.

A method for testing a semiconductor device according to the present invention comprises the steps of: providing a semiconductor chip with a transistor circuit for marking; performing a functional test to the chip to determine whether the chip is a defective or not; inputting a signal for causing latch-up to occur to the transistor circuit for marking when the chip is determined as a defective and damaging the marking transistor circuit to allow the marking transistor to be visually identified.

The transistor circuit for marking can be constituted such that the circuit is a CMOS transistor circuit and has a signal terminal for test for inputting the signal for causing latch-up. In this case, the transistor circuit for marking can includes: a P-type MOS transistor and an N-type MOS transistor connected in series between a power supply pad and a ground pad; a first inverter connected to the signal terminal for test and having an output terminal connected to a drain of the N-type MOS transistor; and a second inverter into which an output signal of the first inverter is inputted and an output terminal of which is connected to a drain of the P-type MOS transistor.

In addition, a semiconductor device according to the present invention comprises: a transistor circuit for marking other than a functional circuit provided at a semiconductor chip; a test signal input terminal for inputting a signal causing latch-up to occur to the transistor circuit for marking, wherein the latch-up occurs to the transistor circuit for marking by inputting the signal into the test signal input terminal and the transistor circuit for marking is thereby damaged.

In this semiconductor device, the transistor circuit for marking can be constituted of a CMOS transistor circuit structure. In this case, the transistor circuit for marking can include: a P-type MOS transistor and an N-type MOS transistor connected in series between a power supply pad and a ground pad; a first inverter connected to the test signal terminal and having an output terminal connected to a drain of the N-type MOS transistor; and a second inverter into which an output signal of the first inverter is inputted and an output terminal of which is connected to a drain of the P-type MOS transistor.

According to the present invention, a transistor circuit for marking consisting of a transistor having particularly weak latch-up characteristics is installed on a semiconductor chip.

When a wafer functional test is performed, latch-up is caused to occur to the transistor circuit for marking of a chip determined as a defective and the peripheral portion of the transistor is broken, thereby visually identifying the defective chip. Therefore, in the present invention, a signal for causing latch-up does not need to be a high voltage or high current signal. Thus, disadvantages of the conventional techniques are not produced.

DESCRIPTION OF THE PREFERRED EMBODIMENTS

Figure 1:
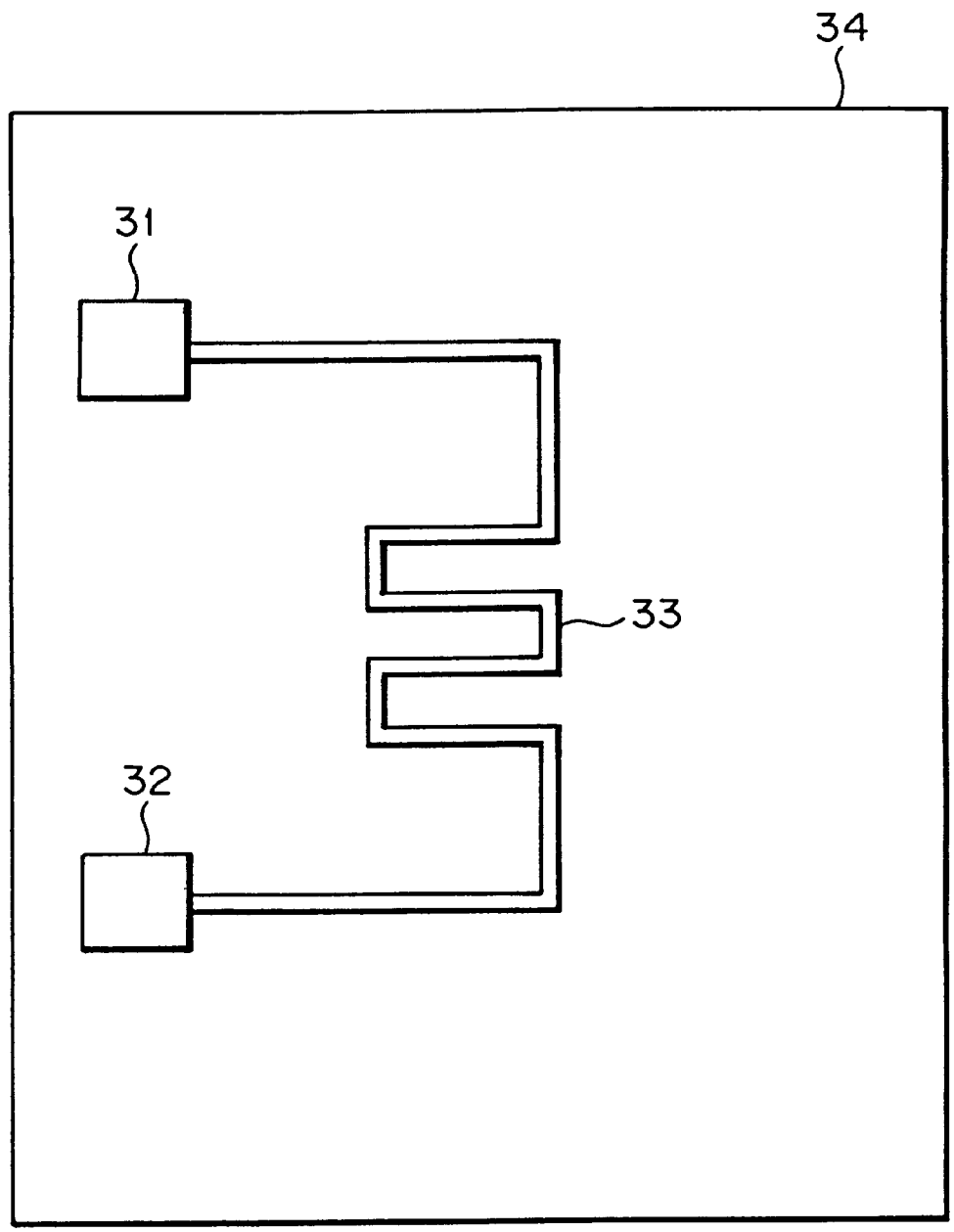
FIG. 1 is a typical plan view of a semiconductor chip to describe a conventional method for marking a semiconductor device.
Figure 2:
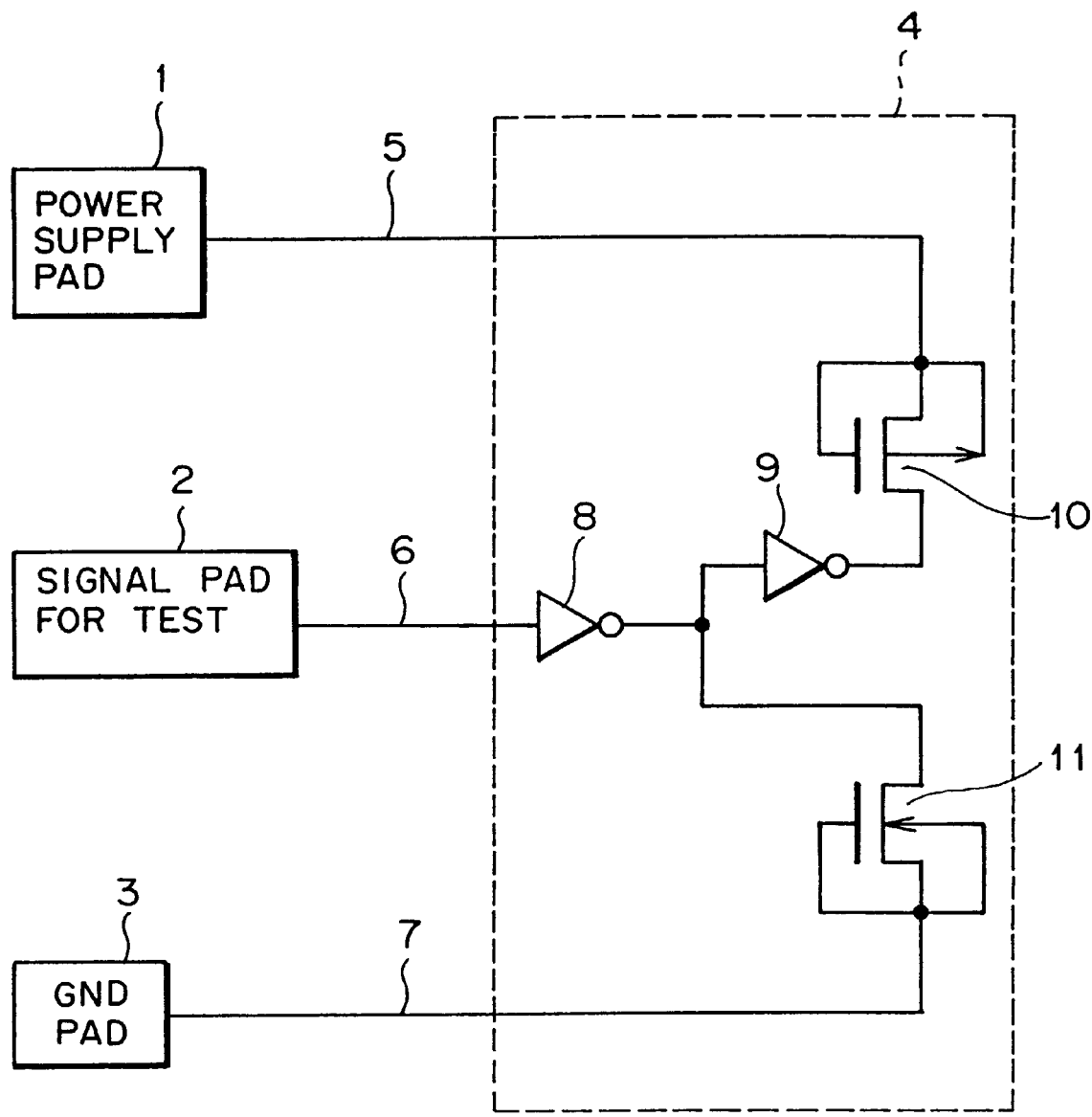
FIG. 2 is a circuit diagram showing a semiconductor device in an embodiment according to the present invention.

Preferred embodiments according to the present invention will now be described concretely with reference to the accompanying drawings. FIG. 2 is a circuit diagram showing a semiconductor device according to the embodiment of the present invention. In the present embodiment, each chip is provided with a power supply pad 1, a signal pad 2 for testing, a GND (ground) pad 3 and a transistor circuit for marking 4. The transistor circuit for marking 4 includes a P-type MOS transistor 10 and an N-type MOS transistor 11 connected in series between the power supply pad 1 and the GND pad 3, and the first inverter 8 and the second inverter 9.

The first inverter 8 is connected to the test signal pad 2. From the pad 2, a test signal 6 is inputted. The second inverter 9 inputs an output signal of the first inverter 8. The source and the gate of the P-type MOS transistor 10 are connected to the power supply pad 1. From the power supply pad 1, a power supply signal 5 is inputted. The drain of the P-type MOS transistor 10 is connected to the output terminal of the second inverter 9. The source and the gate of the N-type MOS transistor 11 are connected to the GND pad 3. From the GND pad 3, a GND signal 7 is inputted. The drain of the N-type MOS transistor 11 is connected to the output terminal of the first inverter 8.

Figure 3:
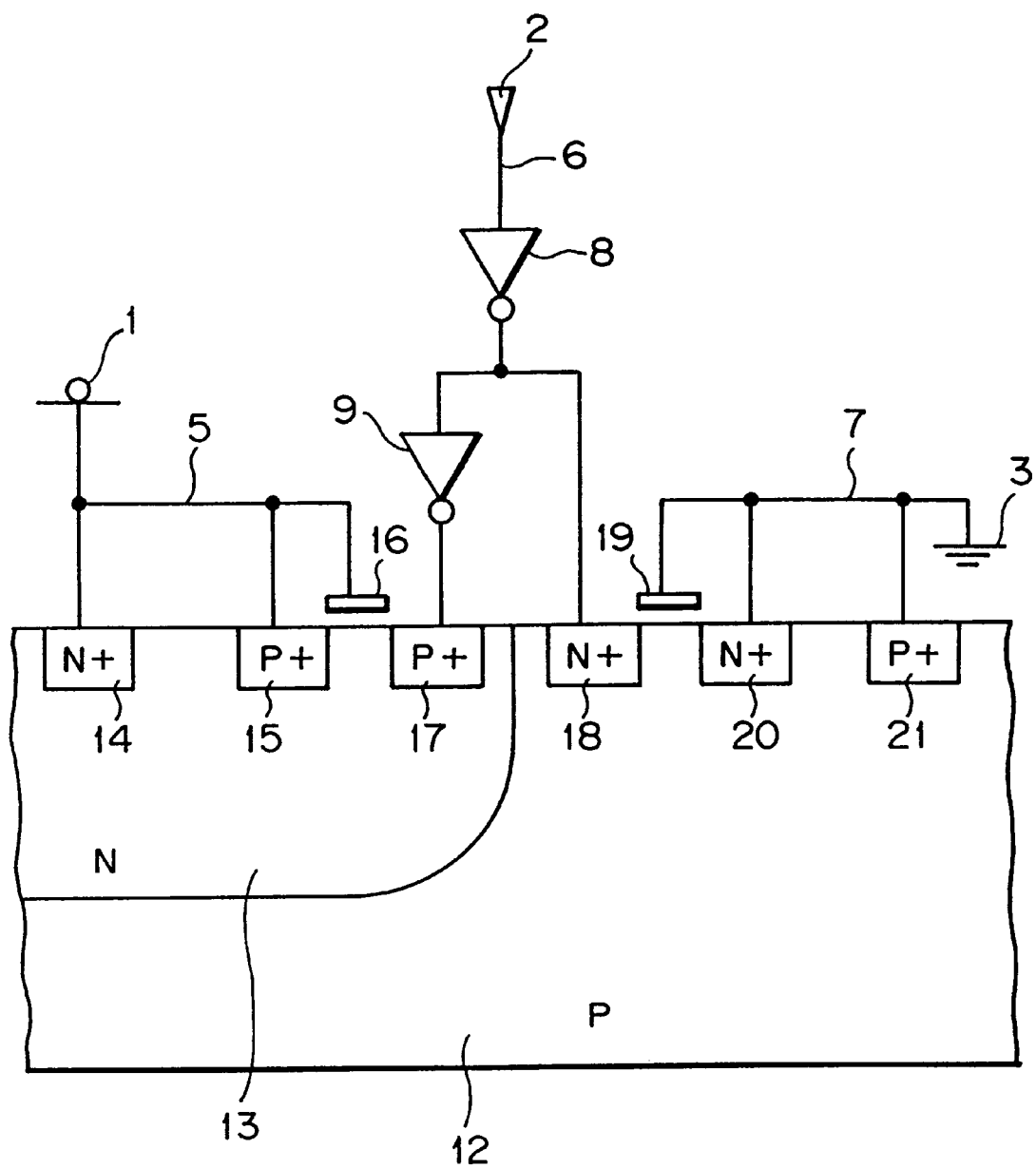
FIG. 3 is a typical cross-sectional view showing the structure of a transistor circuit for marking of the semiconductor device in the embodiment according to the present invention.

FIG. 3 is a typical cross-sectional view showing the structure of the marking circuit 4. An N well region 13 is formed in a P-type semiconductor substrate 12. An N-type well contact 14, a source 15 of the P-type transistor 10, a gate 16 of the P-type transistor 10 and a drain 17 of the P-type transistor 10 are provided in the N well region 13. A drain 18 of the N-type transistor 11, a gate 19 of the N-type transistor 11, a source 20 of the N-type transistor 11 and a P-type sub-contact 21 are provided on the surface of a region other than the N-well region 13 of the P-type semiconductor substrate 12. The N-type well contact 14, the P-type transistor source 15 and the P-type transistor gate 16 are connected to the power supply pad 1 so that a power supply signal 5 is inputted into the contact 14, the source 15 and the gate 16. The N-type transistor gate 19, the N-type transistor source 20 and the P-type sub-contact 21 are connected to the GND pad 3 so that a GND signal 7 is inputted into the gate 19, the source 20 and the sub-contact 21. The drain 17 of the P-type transistor 10 is connected to the output of the second inverter 9. The drain 18 of the N-type transistor 11 is connected to the output of the first inverter 8.

The overlap between the P-type transistor drain 17 and the N well region 13 is made as little as possible. The distance between the N-type transistor drain 18 and the N well region 13 is made as short as possible. The impurity concentration of the N well region 13 is made low and the depth of the N well region 13 is made small. By so doing, latch-up characteristics of the marking circuit 4 is lowered.

The N-type well contact 14 and the P-type sub-contact 21 are arranged to surround the marking circuit 4 as a guard band. This is intended to prevent the latch-up of the marking circuit 4 from adversely affecting external circuits and to prevent unexpected latch-up from occurring to the marking circuit 4 due to noise or the like of the external circuits.

Figure 4:
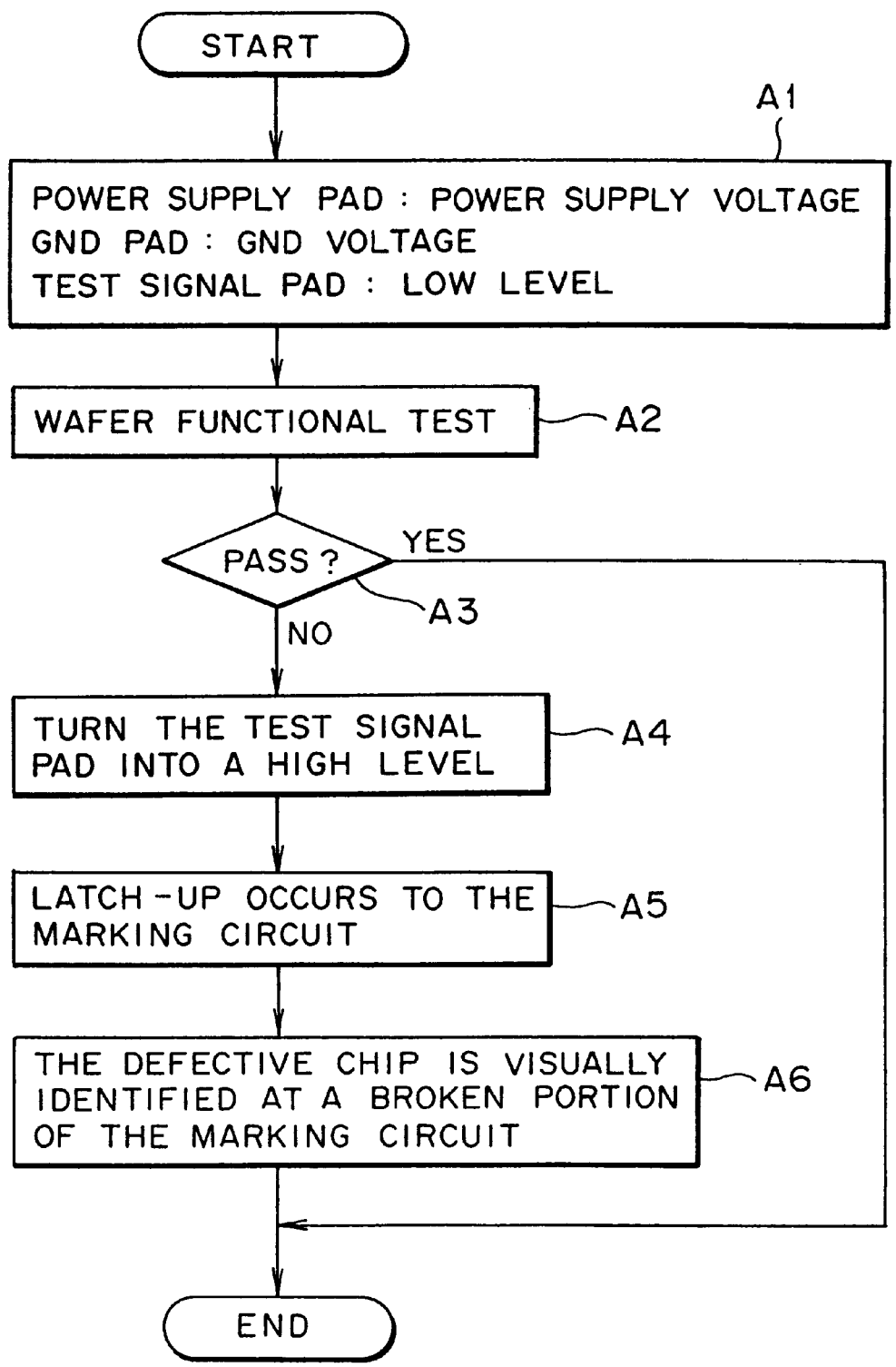
FIG. 4 is a flow chart for describing the operation of the semiconductor device in the embodiment according to the present invention.

Next, a method for testing a semiconductor device in the present embodiment will be described with reference to the flow chart of FIG. 4. Prior to performing a wafer functional test for every chip, a predetermined power supply voltage and a GND voltage are applied to the power supply pad 1 and the GND pad 3, respectively and the test signal pad is kept at a low level (step A1).

Next, a normal wafer functional test is performed (step A2). When the result of the step A2 is PASS (non-defective), the chip is determined as a non-defective by the functional test and the process is ended (step A3). When the result of the step A2 is not PASS (defective), the signal inputted to the test signal pad 2 is changed to a high level (step A4).

If so changing, the P-type transistor drain 17 turns into a high level and the N-type transistor drain 18 turns into a low level. At this time, a portion of the holes stored in the P-type transistor drain 17 pass the N well region 13 and reach the N-type transistor drain 18. Conversely, a portion of the electrons stored in the N-type transistor drain 18 pass to the N well region 13 and reach the P-type transistor drain 17. Due to the narrow distance between the P-type transistor drain 17 and the N-type transistor drain 18, a current tends to flow therebetween. This leads to amplifying the current between the P-type semiconductor substrate 12 and the N well region 13 and to generating a latch-up phenomenon that a large amount of penetrating current flows between the power supply signal 5 and the GND signal 7 (step A5). As a result of a large amount of penetrating current flowing, the interior of the marking circuit 4 is somewhat damaged such as fusing an aluminum wiring member provided within the marking circuit 4. It is thus possible to identify a defective chip depending on whether or not the peripheral of the marking circuit 4 is damaged in, for example, a wafer appearance test (step A6).

As can be seen from the above description, in the present embodiment, it is possible to easily recognize a marked portion in a wafer test to be conducted in a later step by breaking a marking circuit provided in a specific position within the LSI chip. Needless to say, in the present embodiment, the problem of variations in marking portion seen in the case of using mechanical means such as a probing unit, can be resolved and erroneous marking of an adjacent chip does not occur.

Moreover, the present embodiment utilizes latch-up characteristics of the CMOS transistor and causes latch-up of the transistor, thereby breaking the transistor. Owing to this, unlike the conventional techniques, there is no need to apply a high voltage or a high current in the present embodiment.

Figure 5:
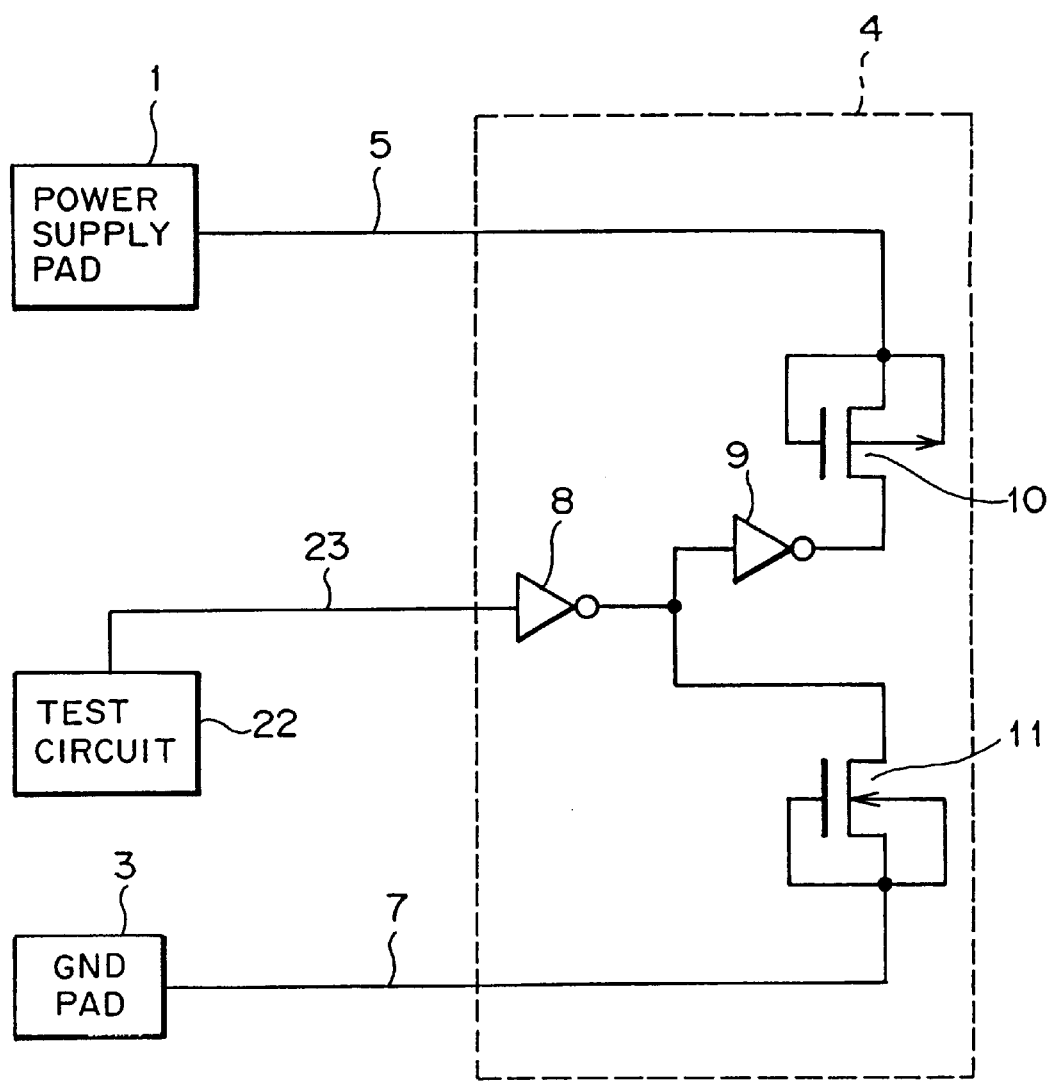
FIG. 5 is a circuit diagram showing a semiconductor device in another embodiment according to the present invention.

Next, another embodiment of the present invention will be described. FIG. 5 is a circuit diagram showing a semiconductor device in the present embodiment. The present embodiment differs from the embodiment shown in FIG. 2 in that a test circuit 22 to perform a self diagnostic test within the LSI is provided instead of the signal pad for test 2. When the result of the self diagnostic test of the test circuit 22 shows that an LSI chip is defective, the test circuit 22 outputs a fail signal 23 indicating the chip is a defective. In other words, the constitution of the present embodiment is the same as that in FIGS. 2 and 3 except that the test signal 6 in the embodiment of FIG. 2 is replaced by the fail signal 23.

Figure 6:
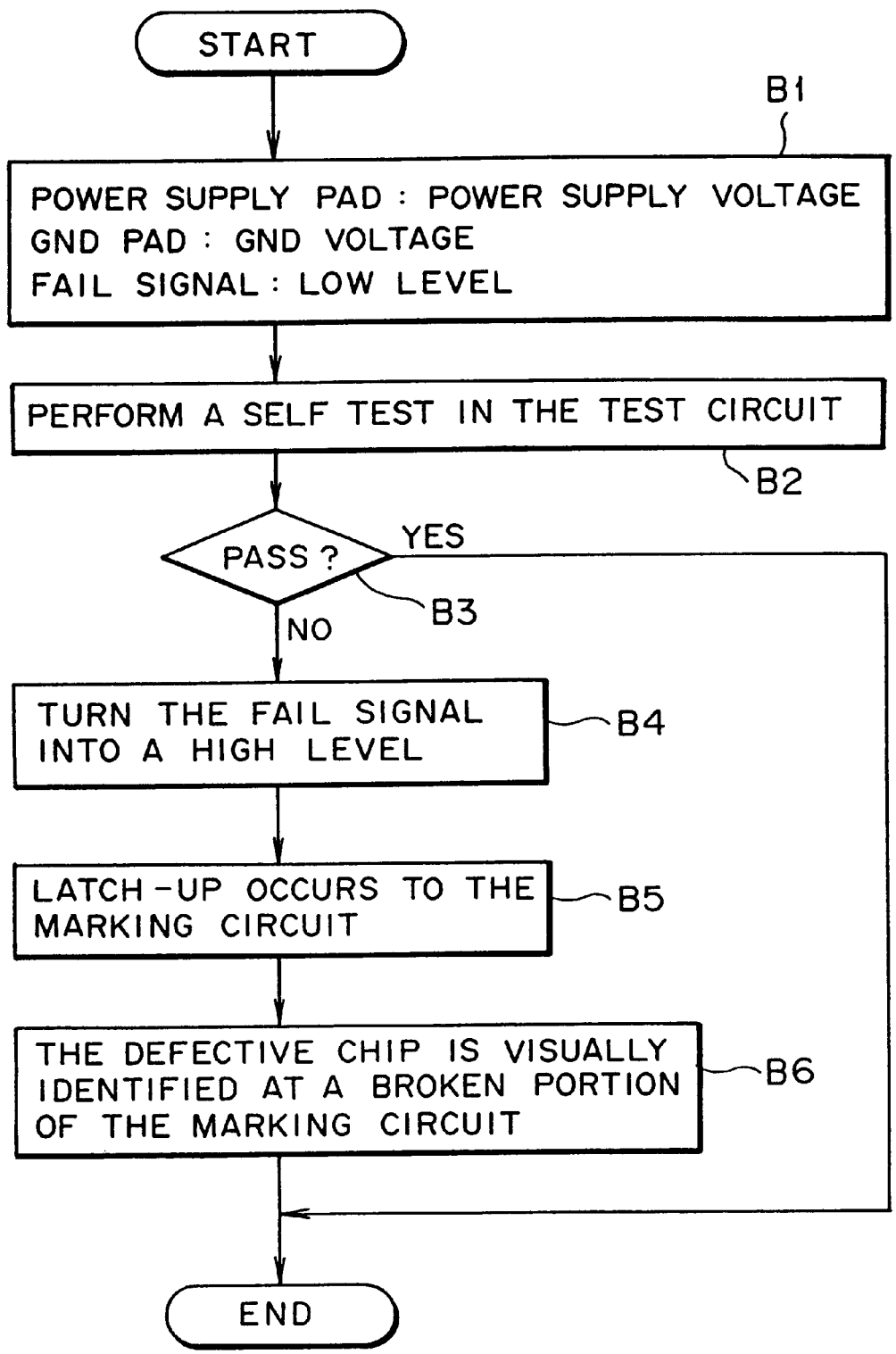
FIG. 6 is a flow chart for describing the operation of the semiconductor device in another embodiment according to the present invention.

The operation of the present embodiment will next be described with reference to the flow chart of FIG. 6. Namely, prior to performing a wafer functional test to each chip, a predetermined power supply voltage and a GND voltage are applied to the power supply pad 1 and the GND pad 3, respectively. The fail signal 23 which is the output of the test circuit 22 is maintained at a low level (step B1).

Using the test circuit 22, a self diagnostic test is conducted to an LSI chip itself (step B2). When the result of the step B2 is PASS, the chip is determined as non-defective in the self diagnostic test and the process is ended (step B3). When the result is not PASS, the test signal 22 outputs a high-level signal as a fail signal 23 (step S4). As a result, latch-up occurs to the marking transistor circuit 4 (step S5) and the defective chip is visually recognized at the broken portion of the marking transistor circuit 4 (step B6).

The present embodiment differs from that shown in FIGS. 2 to 4 as follows. In the embodiment of FIGS. 2 to 4, a trigger signal causing latch-up of the transistor within the transistor circuit for marking 4 is inputted from an external terminal. In the present embodiment, by contrast, a corresponding signal is generated within the internal circuit. Due to this, in the present embodiment, it is possible to reduce one external terminal by generating a fail signal 23 from the test circuit 22 provided within the LSI.

As described so far, according to the present invention, by causing latch-up of the transistor circuit for marking of, for example, CMOS transistor structure, the transistor is damaged and a defective chip is marked. This ensures marking a defective chip and makes it possible to easily recognize the marked portion in a wafer test in a later step. Besides, according to the present invention, since the transistor is damaged by using latch-up characteristics of, for example, a CMOS transistor, there is no need to apply a high voltage or high current as shown in the conventional techniques, thereby avoiding adversely affecting peripheral circuits.

What is claimed is:

1. A method for testing a semiconductor device comprising the steps of:

providing a semiconductor chip with a transistor circuit for marking;

performing a functional test on the chip to determine whether the chip is defective;

inputting a signal for causing latch-up to occur in said marking transistor circuit when the chip is determined as defective and damaging said marking transistor circuit to allow said marking transistor to be visually identified;

wherein said marking transistor circuit is a CMOS transistor circuit and has a test signal terminal for inputting the signal for causing latch-up; and wherein said transistor circuit for marking includes:
      a P-type MOS transistor and an N-type MOS transistor connected in series between a power supply pad and a ground pad;
      a first inverter connected to the test signal terminal and having an output terminal connected to a drain of said N-type MOS transistor; and
      a second inverter into which an output signal of the first inverter is inputted and an output terminal of which is connected to a drain of said P-type MOS transistor.

2. A semiconductor device comprising:

a transistor circuit for marking other than a functional circuit provided at a semiconductor chip;

a test signal input terminal for inputting a signal causing latch-up to occur in said marking transistor circuit, wherein the latch-up is caused to occur in said marking transistor circuit by inputting said signal into the test signal input terminal and said marking transistor circuit is thereby damaged;

wherein said transistor circuit for marking includes:
      a P-type MOS transistor and an N-type MOS transistor connected in series between a power supply pad and a ground pad;
      a first inverter connected to the test signal terminal and having an output terminal connected to a drain of said N-type MOS transistor; and
      a second inverter into which an output signal of the first inverter is inputted and an output terminal of which is connected to a drain of said P-type MOS transistor.

* * * * *